(12) United States Patent  
Sudo et al.

(10) Patent No.: US 8,268,080 B2  
(45) Date of Patent: Sep. 18, 2012

(54) APPARATUS AND METHOD FOR PREPARING COMPOSITE PARTICULATES USING VAPOR DEPOSITION

(75) Inventors: Go Sudo, Kanagawa (JP); Kenji Katori, Kanagawa (JP); Hayato Hommura, Kanagawa (JP); Hiroshi Matsuki, Tokyo (JP); Akio Kayanuma, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/395,958

(22) Filed: Mar. 2, 2009

(65) Prior Publication Data

US 2009/0246366 A1 Oct. 1, 2009

(30) Foreign Application Priority Data

Mar. 25, 2008 (JP) ................................ 2008-076964

(51) Int. Cl.
- *C23C 16/00* (2006.01)
- *B05C 15/00* (2006.01)
- *B05C 11/02* (2006.01)
- *B05D 3/12* (2006.01)

(52) U.S. Cl. ........ 118/729; 427/242; 427/294; 427/213; 118/303; 118/314; 118/320; 118/52; 118/716

(58) Field of Classification Search ................. 118/317, 118/318, 319, 52, 716, 719
See application file for complete search history.

(56) References Cited

U.S. PATENT DOCUMENTS

| | | | | |
|---|---|---|---|---|
| 2,846,971 A | * | 8/1958 | Baer et al. | 118/716 |
| 4,116,161 A | * | 9/1978 | Steube | 118/715 |
| 4,448,821 A | * | 5/1984 | Buschor | 427/424 |
| 4,614,162 A | * | 9/1986 | Ryan et al. | 118/19 |
| 4,715,316 A | * | 12/1987 | Broomfield et al. | 118/716 |
| 4,758,288 A | * | 7/1988 | Versic | 149/6 |
| 5,198,272 A | * | 3/1993 | Eisfeller | 427/251 |
| 5,393,346 A | * | 2/1995 | Cholewa | 118/320 |
| 5,470,388 A | * | 11/1995 | Goedicke et al. | 118/716 |
| 5,494,709 A | * | 2/1996 | Long et al. | 427/4 |
| 5,593,097 A | * | 1/1997 | Corbin | 241/21 |

(Continued)

FOREIGN PATENT DOCUMENTS

JP 56-041375 4/1981

(Continued)

OTHER PUBLICATIONS

Japanese Patent Application No. 2008-076964, Japanese Office Action issued on Oct. 5, 2010.

(Continued)

*Primary Examiner* — Dah-Wei Yuan  
*Assistant Examiner* — K. V. Kurple  
(74) *Attorney, Agent, or Firm* — SNR Denton US LLP

(57) ABSTRACT

Disclosed herein is an apparatus for preparing composite particulates, including a rotary body having a bottom surface and a side wall and operative to contain particulates to which an adhering material is to be made to adhere; a centrifugal machine for rotating the rotary body so as to apply centrifugal forces to the particulates in the rotary body; and an inclination varying device operative to vary the inclination of the rotary body to an arbitrary inclination angle in the range from an angle at which the bottom surface of the rotary body forms a horizontal surface perpendicular to the direction of gravity to an angle at which the bottom surface forms a vertical surface parallel to the direction of gravity, and operative to support the rotary body at the arbitrary inclination angle.

13 Claims, 6 Drawing Sheets

U.S. PATENT DOCUMENTS

| | | | |
|---|---|---|---|
| 5,750,996 A * | 5/1998 | Drennen et al. | 250/341.2 |
| 5,882,725 A * | 3/1999 | Radford | 427/212 |
| 6,060,129 A * | 5/2000 | Thomas et al. | 427/490 |
| 6,375,745 B1 * | 4/2002 | Yira et al. | 118/716 |
| 6,596,342 B2 * | 7/2003 | Batliner et al. | 427/242 |
| 2002/0182338 A1 * | 12/2002 | Stevens et al. | 427/457 |
| 2006/0193978 A1 * | 8/2006 | Toth | 427/212 |

FOREIGN PATENT DOCUMENTS

| | | |
|---|---|---|
| JP | 05-271921 | 10/1993 |
| JP | 07-226182 | 8/1995 |
| JP | 10-204613 | 8/1998 |
| JP | 11-100606 | 4/1999 |
| JP | 2004-250771 | 9/2004 |
| JP | 2005-281765 | 10/2005 |
| JP | 2007-204784 | 8/2007 |
| JP | 2008-045197 | 2/2008 |

OTHER PUBLICATIONS

Japanese Patent Office Action corresponding to Japanese Serial No. 2008-076964 dated Mar. 30, 2010.

* cited by examiner

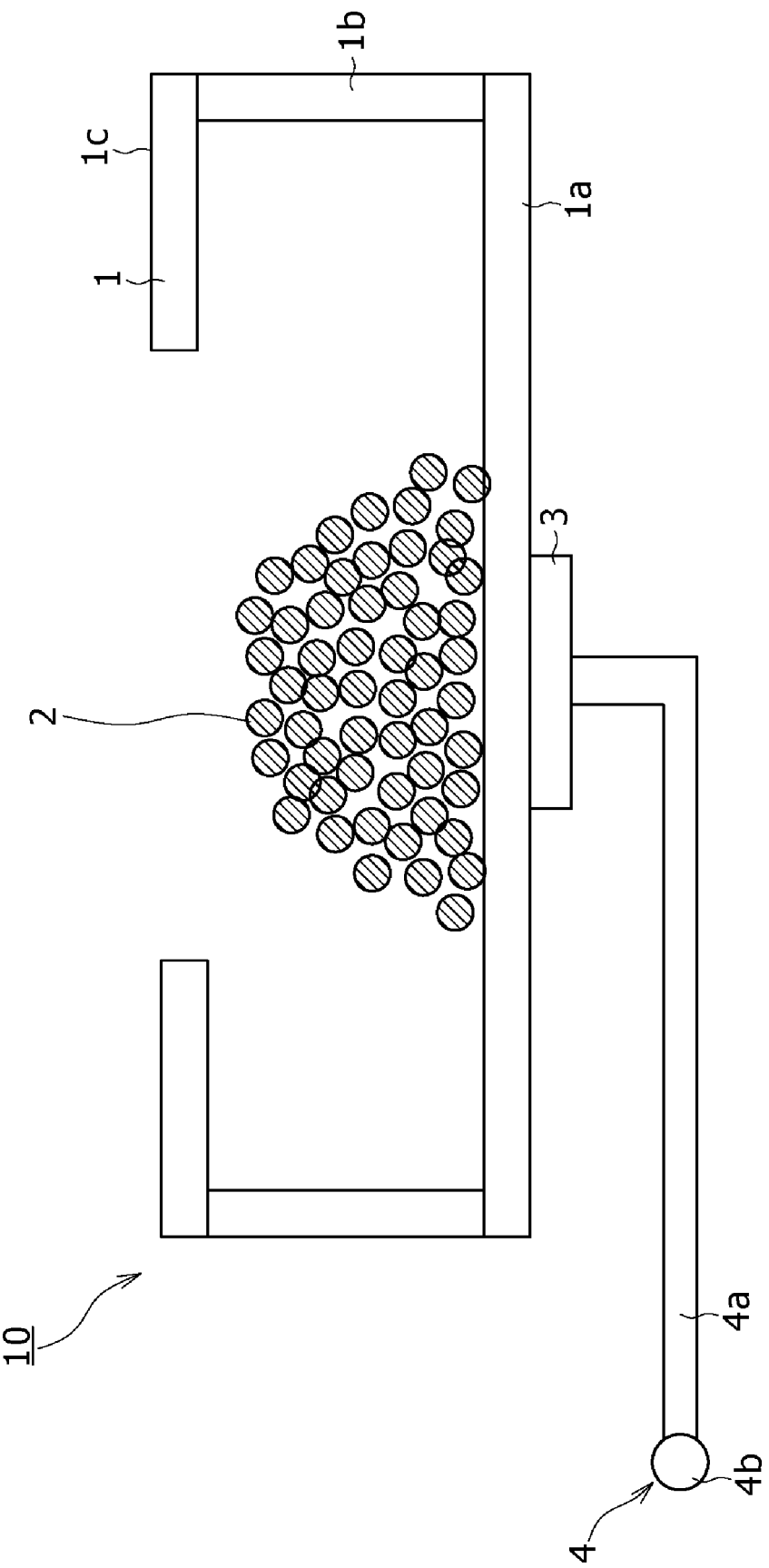

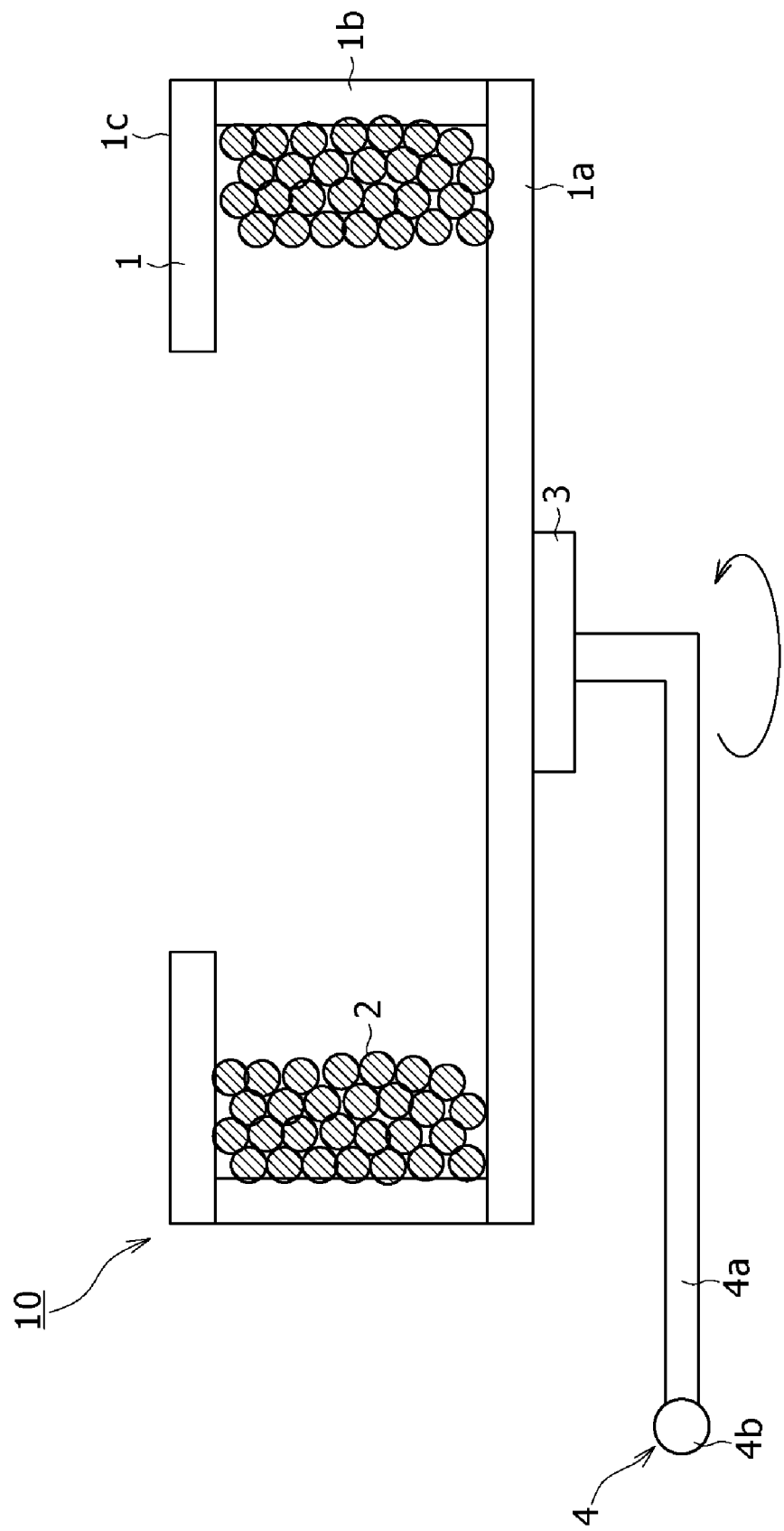

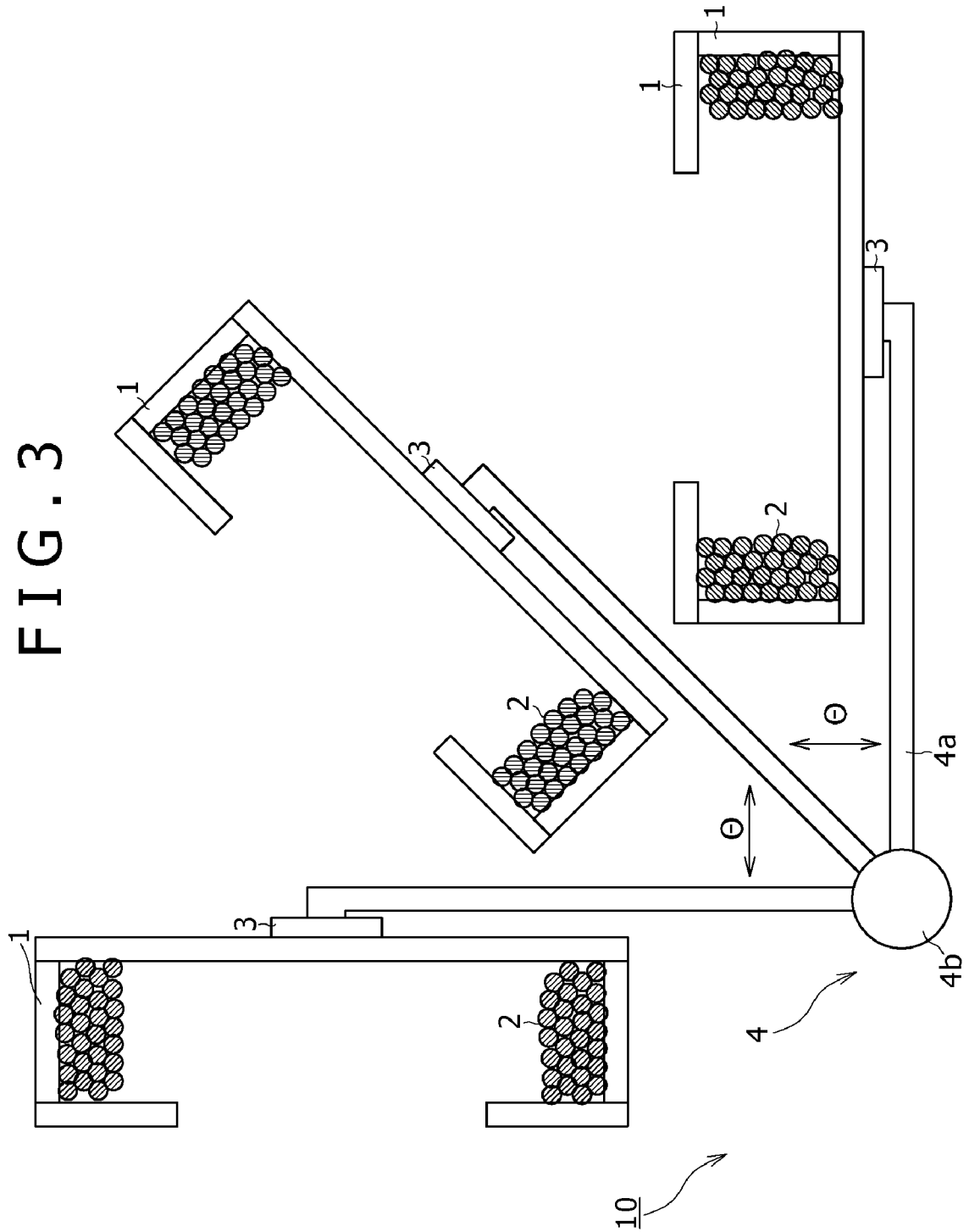

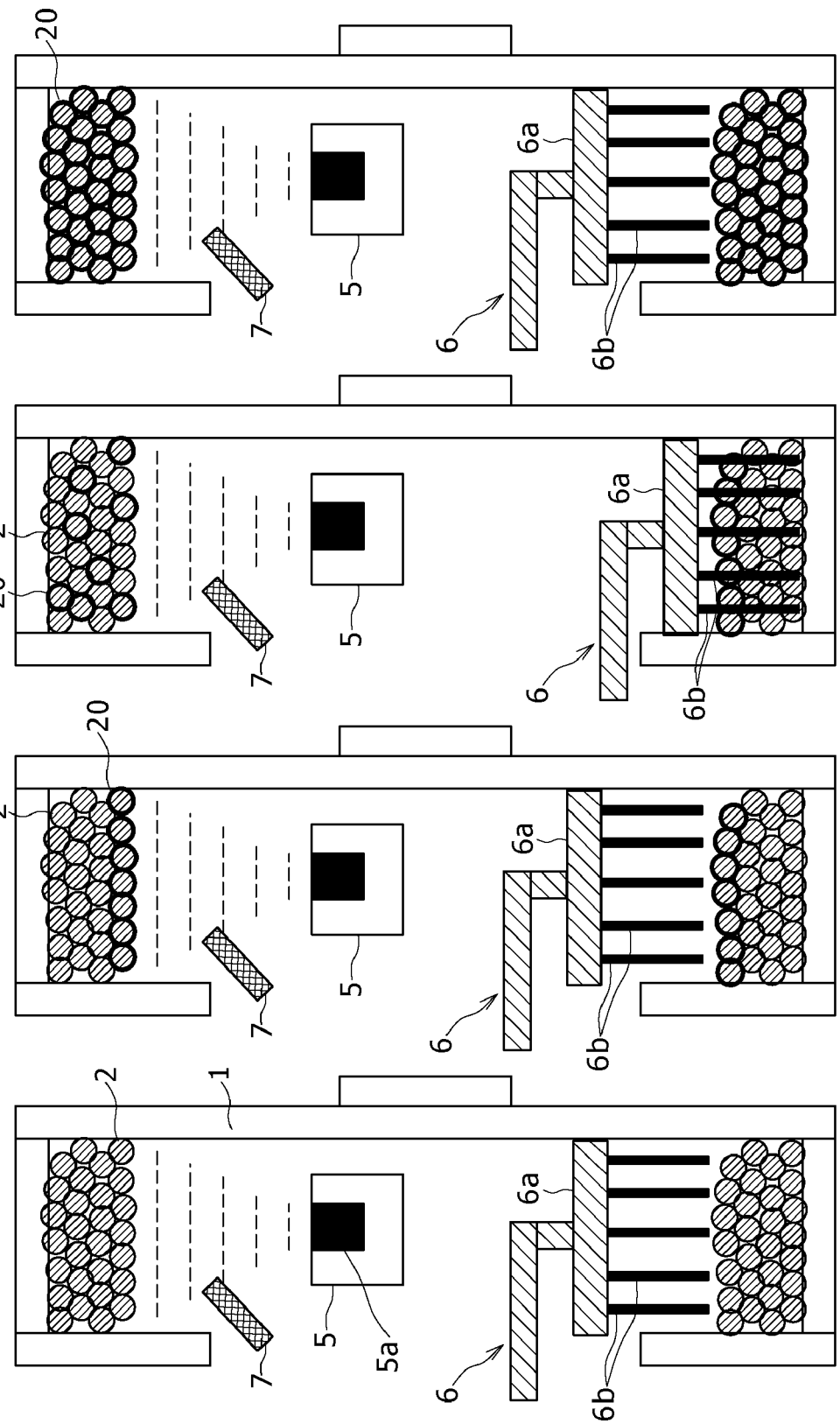

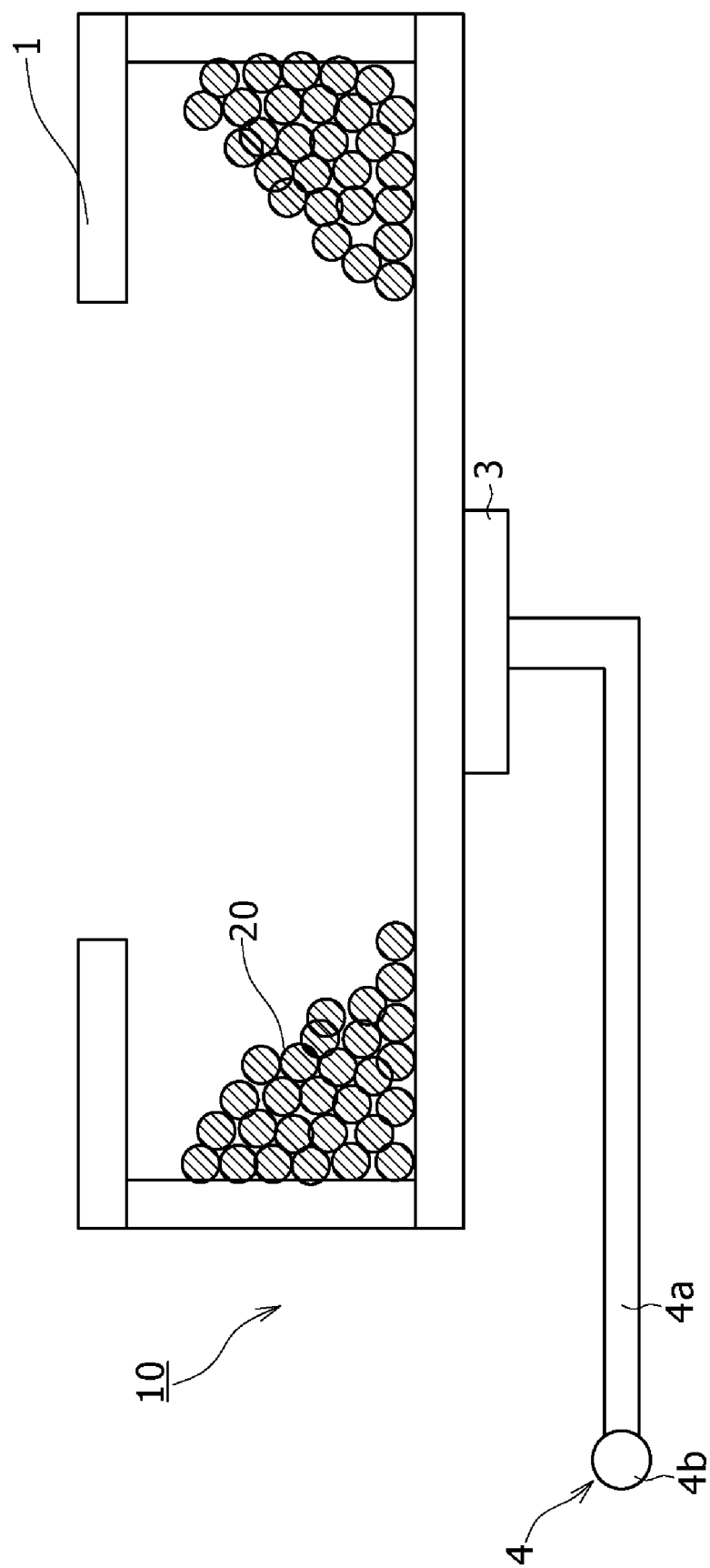

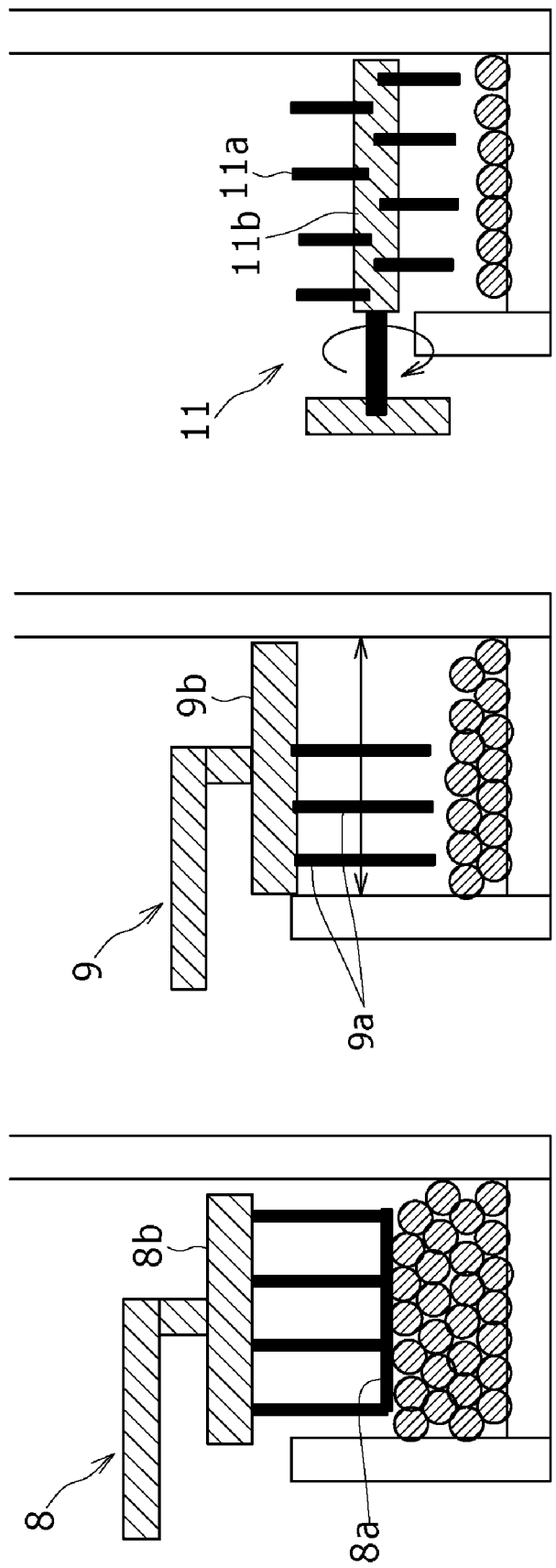

US 8,268,080 B2

APPARATUS AND METHOD FOR PREPARING COMPOSITE PARTICULATES USING VAPOR DEPOSITION

CROSS REFERENCES TO RELATED APPLICATIONS

The present invention contains subject matter related to Japanese Patent Application JP 2008-076964 filed in the Japan Patent Office on Mar. 25, 2008, the entire contents of which being incorporated herein by reference.

BACKGROUND OF THE INVENTION

1. Field of the Invention

The present invention relates to an apparatus and a method for preparing composite particulates by which an adhering material is made to adhere to particulates so as to form composite particulates.

2. Description of the Related Art

As a method for causing an adhering material to adhere to an adhesion substrate (a member to which the adhering material is to adhere), there have been known the PVD (physical vapor deposition) method and the CVD (chemical vapor deposition) method. The CVD method is a method in which an adhering material (depositing material) is made to adhere to the adhesion substrate (deposition substrate) by a chemical reaction in a vapor phase. The PVD method is a method in which an adhering material is caused to adhere to the adhesion substrate by thermal vapor deposition, sputtering, ion plating or the like.

Of the CVD method and the PVD method, an appropriate one is selected and used, depending on the material constituting the adhesion substrate and the adhering material. In the cases where the adhesion substrate is particulates, use is often made of the PVD method which has a comparatively wide range of selection of the adhering material, among others, the sputtering method.

The sputtering method is a method in which an anode and a cathode are arranged in a He or Ar gas atmosphere together with an adhesion substrate and an adhering material (target) which are located between the anode and the cathode, and a voltage is impressed between the electrodes, whereby the adhering material is sputtered from the target and made to adhere to the adhesion substrate.

For the cases where the adhesion substrate is particulates, various forms of sputtering apparatuses have been proposed in order to achieve uniform adhesion of the adhering material to the whole part of the particulates.

Examples of the sputtering apparatuses proposed hitherto include a sputtering apparatus in which two cylindrical electrodes are coaxially arranged on the inner side and the outer side and the outer-side electrode is provided with vanes on the inner side thereof (Japanese Patent Laid-Open No. Sho 56-41375), and a sputtering apparatus which is arranged inside a rotary drum for containing a powder along the axial direction (Japanese Patent Laid-Open No. Hei 5-271921).

In addition to the above, a polygonal barrel sputtering apparatus has been proposed which includes a vacuum vessel polygonal in vertical sectional shape, a rotating mechanism for rotating the vacuum vessel, and a sputtering target disposed inside the vacuum vessel (Japanese Patent Laid-Open No. 2004-250771). In this sputtering apparatus, an adhering material is made to adhere to the surfaces of particulates contained in the vacuum vessel while rotating the vacuum vessel.

Also, there has been proposed a method of preparing a composite powder in which a tubular rotary stage and a source of an adhering material located at such a position as to be surrounded by the rotary stage are provided, and the powder is pressed against the inner surface of the rotary stage by centrifugal forces generated by rotating the rotary stage (Japanese Patent Laid-Open No. 2008-45197).

SUMMARY OF THE INVENTION

It is known that the method for adhesion (deposition) by sputtering needs a long treatment time because of the low build-up rate (film growth rate), so that it may be impossible by this method to achieve a sufficiently enhanced productivity, depending on the use thereof.

On the other hand, the method by thermal vapor deposition is known to promise a high build-up rate and good productivity. However, unlike the sputtering method, the thermal vapor deposition method may not achieve adhesion (deposition) in a down-sputtering mode in which the adhering material (sputtering target) is disposed on the upper side and the adhering material is sputtered onto the adhesion substrate disposed on the lower side.

Specifically, in the thermal vapor deposition method, the adhesion substrate has to be disposed on the upper side of the vapor source (adhering material) in the manner of facing the vapor source (adhering material) so that the adhering material is evaporated by heating and is caused to adhere to the adhesion substrate.

In the case where the adhesion substrate is a comparatively large substrate such as a substrate of a microcircuit or integrated circuit, it is possible to dispose the substrate in an emission region on the upper side of the vapor source (adhering material) in the manner of facing the vapor source (adhering material), for example, to fix the substrate in the desired position by suction.

In the case where the adhesion substrate is particulates, on the other hand, it is not easy to dispose the plurality of particulates on the upper side of the vapor source (adhering material) in the manner of facing the vapor source (adhering material). Moreover, it is difficult to uniformly vapor-deposit the adhering material to the individual ones of the plurality of particulates stacked on the upper side of and oppositely to the vapor source.

For example, as proposed in Japanese Patent Laid-Open No. 2008-45197, the particulates may be pressed by centrifugal forces against the inner surface of a rotary stage surrounding the vapor source (adhering material). In this case, the particulates are made to traverse the upper side of the vapor source (adhering material) where the emission region of the vapor source (adhering material) exists, so that the adhering material can be easily vapor-deposited on the particulates.

However, it is difficult to recover the thus prepared composite particulates from the inner surface of the cylindrical rotary stage. Thus, the recovery may be low.

Thus, there is a need for an apparatus and a method for preparing composite particulates in which particulates placed in a rotary body are given centrifugal forces, an adhering material (depositing material) can be easily made to uniformly adhere to (deposit on) the surfaces of the particulates, and the recovery of the composite particulates thus prepared through adhesion (deposition) of the adhering material (depositing material) can be enhanced, leading to enhanced productivity.

In order to fulfill the above-mentioned need, the present inventors made intensive and extensive investigations. As a result of their investigations, it was found out that the above-mentioned need can be fulfilled by a system including a mechanism for applying centrifugal forces to particulates contained in a rotary body having a bottom surface and a side wall, and an inclination varying mechanism for varying the inclination angle of the rotary body to an arbitrary angle and supporting the rotary body in the thus inclined state.

According to one embodiment of the present invention, there is provided an apparatus for preparing composite particulates, including a rotary body having a bottom surface and a side wall and operative to contain particulates to which an adhering material is to be made to adhere; a centrifugal machine for rotating the rotary body so as to apply centrifugal forces to the particulates in the rotary body; and an inclination varying device operative to vary the inclination of the rotary body to an arbitrary inclination angle in the range from an angle at which the bottom surface of the rotary body forms a horizontal surface perpendicular to the direction of gravity to an angle at which the bottom surface forms a vertical surface parallel to the direction of gravity, and operative to support the rotary body at the arbitrary inclination angle.

According to another embodiment of the present invention, there is provided a method of preparing composite materials, including the steps of containing particulates to which an adhering material is to be made to adhere, in a rotary body having a bottom surface and a side wall; rotating the rotary body so as to apply centrifugal forces to the particulates in the rotary body; and varying the inclination of the rotary body to an arbitrary inclination angle in the range from an angle at which the bottom surface of the rotary body forms a horizontal surface perpendicular to the direction of gravity to an angle at which the bottom surface forms a vertical surface parallel to the direction of gravity, and supporting the rotary body at the arbitrary inclination angle.

In accordance with the embodiments of the present invention, it is possible to apply centrifugal forces to the particulates contained in the rotary body, and thereby to easily cause the adhering material to adhere substantially uniformly to the surfaces of the particulates. Besides, it is possible to enhance the recovery of the composite particulates thus prepared by adhesion (deposition) of the adhering material (depositing material), and to enhance the productivity.

BRIEF DESCRIPTION OF THE DRAWINGS

FIG. 1 illustrates an exemplary preferred embodiment of the apparatus for preparing composite particulates according to an embodiment of the present invention;

FIG. 2 illustrates the condition where centrifugal forces are given to the particulates, in the apparatus for preparing composite particulates shown in FIG. 1;

FIG. 3 illustrates the condition where the inclination of the rotary body is varied, in the apparatus for preparing composite particulates shown in FIG. 1;

FIGS. 4A to 4D illustrate steps for preparing the composite particulates, in the apparatus for preparing composite particulates shown in FIG. 1;

FIG. 5 illustrates the condition at the time of recovering the composite particulates prepared, in the apparatus for preparing composite particulates shown in FIG. 1; and FIGS. 6A to 6C illustrate exemplary preferred embodiments of a stirrer used in the apparatus for preparing composite particulates according to the present embodiment.

DETAILED DESCRIPTION OF THE PREFERRED EMBODIMENTS

Now, embodiments of the present invention will be described more in detail below referring to the drawings.

FIGS. 1 to 5 illustrate an exemplary preferred embodiment of the apparatus for preparing composite particulates according to an embodiment of the present invention. As shown in FIG. 1, the composite material preparing apparatus 10 according to the present embodiment includes a rotary body 1 for containing particulates 2 to which an adhering material is to be made to deposit, a centrifugal machine 3 for rotating the rotary body 1 so as to apply centrifugal forces to the particulates 2 contained in the rotary body 1, and an inclination varying device 4 for varying the inclination of the rotary body 1 to an arbitrary inclination angle and supporting the rotary body 1 at the arbitrary inclination angle.

The rotary body 1 includes a bottom surface 1a, a side wall 1b, and a flange part 1c provided at one end part of the side wall 1b so as to face the bottom surface 1a. Incidentally, the flange part 1c is provided in its central area with an opening through which the rotary body 1 is charged with particulates.

The inclination varying device may be an inclination varying device 4 having a turning support member 4a which supports the rotary body 1 and the centrifugal machine 3 and an actuator 4b which turns the turning support member 4a. Incidentally, the actuator 4b may be, for example, a motor or the like.

In addition, the composite particulate preparing apparatus 10 in the present embodiment has a vacuum device (omitted in the drawings) for ensuring that the adhesion of the adhering material to the particulates 2 in the rotary body 1 can be performed in a vacuum atmosphere.

As shown in FIG. 1, before the start of operation of the composite particulate preparing apparatus 10, the rotary body 1 is at rest in the condition where the bottom surface 1a forms a horizontal surface perpendicular to the direction of gravity. The rotary body 1 is charged with particulates 2 to which the adhering material is to be made to adhere.

When charged with the particulates 2, the rotary body 1 is at rest in the condition where the bottom surface 1a forms a horizontal surface orthogonal to the direction of gravity, it is easy to charge the rotary body 1 with the particulates 2.

The particulates 2 have a diameter of several micrometers to several hundreds of micrometers. Examples of the particulates 2 include particulates of high-melting-point metals such as iron, and particulates of carbon.

Next, as shown in FIG. 2, the rotary body 1 is rotated by the centrifugal machine 3, whereby centrifugal forces are exerted on the particulates 2 in the rotary body 1, and the particulates 2 are pressed against the side wall 1b of the rotary body 1.

Preferably, the rotating speed of the rotary body 1 is so set that, even when the inclination of the rotary body 1 is varied to such an extent that the bottom surface 1a of the rotary body 1 becomes parallel to the vertical direction, the particulates 2 would not drop, in other words, a pressing force of not less than that of the gravitational acceleration would be exerted on every one of the particulates 2. Thus, the rotating speed is preferably such that centrifugal forces of not less than 2G are exerted on the particulates 2.

More specifically, the rotating speed of the rotary body 1 is preferably such that the rotary body 1 having the bottom surface 1a with a diameter of about 40 cm and the side wall 1b with a height of about 10 cm is rotated at about 100 rpm. Incidentally, the width of the flange part 1c is preferably about 10 cm.

Since the rotary body 1 is provided with the flange part 1c facing the bottom surface 1a, the particulates 2 in the rotary body 1 would not be scattered away even when the rotary body 1 is rotated to exert the centrifugal forces on the particulates 2; thus, during the rotation, the particulates 2 can be pressed against the side wall 1b.

Subsequently, as shown in FIG. 3, keeping the condition where the centrifugal forces are exerted on the particulates 2 in the rotary body 1, the turning support member 4a is turned by the inclination varying device 4 so as to vary the inclination of the rotary body 1 to an arbitrary inclination angle in the range from an angle at which the bottom surface 1a of the rotary body 1 forms a horizontal surface perpendicular to the direction of gravity to an angle at which the bottom surface 1a forms a vertical surface parallel to the direction of gravity.

The inclination angle (the angle of the turning support member 4a against the horizontal plane) of the rotary body 1, preferably, is such an angle that the particulates 2 given the centrifugal forces would not drop in the direction of gravity.

Specifically, in order to ensure that the adhering material can be easily vapor-deposited on the particulates 2 pressed against the side wall 1b of the rotary body 1, the inclination angle (the angle of the turning support member 4a against the horizontal plane) of the rotary body 1 is preferably 45° to 135°, more preferably 80° to 100°, particularly preferably 90°, against the horizontal plane which is perpendicular to the direction of gravity.

The composite particulate preparing apparatus, preferably, includes a vapor deposition device in which the adhering material is contained.

In the composite particulate preparing apparatus 10 according to this embodiment, a vapor deposition device 5 is provided in the rotary body 1 supported at such an inclination angle that the bottom surface 1a is parallel to the vertical direction (namely, at an inclination angle of 90° against the horizontal plane).

As shown in FIG. 4A, the vapor deposition device 5 is provided inside the rotary body 1 supported at such an inclination angle that the bottom surface 1a is parallel to the vertical direction (namely, at an inclination angle of 90° against the horizontal plane), and the adhering material 5a contained in the vapor deposition device 5 is evaporated by heating, to start vapor deposition.

As shown in FIG. 4B, the particulates 2 contained in the rotary body 1 and pressed against the side wall 1b by the centrifugal forces traverse the evaporating direction of the heated adhering material 5a (the emission region of the adhering material 5a). Therefore, the adhering material evaporated adheres to the particulates 2 aligned at the surface, of the plurality of particulates 2 pressed against the side wall 1b by the centrifugal forces.

According to the embodiments of the present invention, at the time of preparing the composite particulates, the inclination of the rotary body is varied to bring the rotary body to such a position where the adhering material evaporated by heating can easily adhere to the particulates, whereby the adhering material is permitted to adhere to the particulates in the rotary body. Therefore, the efficiency of preparation can be enhanced.

Examples of the adhering material to be made to adhere to the particulates include low-melting-point elemental metals (such as copper and bismuth), alloys, and organic matters such as paraffins and higher aliphatic acids.

The composite particulate preparing apparatus 10 in this embodiment has a stirrer for stirring the particulates 2 pressed against the side wall 1b of the rotary body 1 by the centrifugal forces.

The stirrer may be a comb-shaped stirring member 6 in which, as shown in FIGS. 4A to 4D, a support member 6a parallel to the side wall 1b of the rotary body 1 is provided with a plurality of bar-like members 6b projecting in the same direction.

As shown in FIG. 4C, in operation of the stirring member 6, the combtooth-shaped bar-like members 6b are inserted between the plurality of particulates 2 pressed against the side wall 1b of the rotary body 1 and are brought into line contact with the plurality of particulates 2, whereby the particulates 2 on the surface side and the particulates 2 on the side of the side wall 2b are stirred. With the particulates 2 stirred sufficiently by the stirring member 6, the particulates on the surface side and the particulates on the side of the side wall 2b are replaced by one another, whereby the adhering material can be made to substantially uniformly adhere to the surfaces of the particulates, resulting in preparation of the composite particulates.

As shown in FIGS. 4A to 4D, the composite particulate preparing apparatus 10 in this embodiment, preferably, is provided with a film thickness monitor 7 for measuring the film thickness of the adhering material having adhered to the particulates 2.

As shown in FIG. 4D, the film thickness of the adhering material having adhered to the particulates 2 is measured by the film thickness monitor 7, so as to prepare the composite particles 20 through adhesion of the adhering material in an arbitrary and substantially uniform film thickness.

Incidentally, the measured value of the film thickness of the adhering material as measured by the film thickness monitor 7 may be different from the actually measured value of the film thickness of the adhering material having actually adhered to the particulates 2, depending on the vapor deposition conditions or the like. The ratio of the value measured by the film thickness monitor 7 and the actually measured value is preliminarily calculated, and the adhering material is vapor-deposited on the particulates 2 in an optimal film thickness by way of proportional calculation.

Thereafter, as shown in FIG. 5, the turning support member 4a is turned by the inclination varying device 4 to vary the inclination angle of the rotary body 1 from the angle at which the bottom surface 1a of the rotary body 1 forms a vertical surface parallel to the direction of gravity to the angle at which the bottom surface 1a forms a horizontal surface perpendicular to the direction of gravity, and the centrifugal machine 3 is stopped.

With the centrifugal machine 3 stopped, the composite particulates 20 having been pressed against the side wall 1b of the rotary body 1 by the centrifugal forces drop in the direction of gravity, and the thus dropped composite particulates 20 are recovered.

According to the embodiments of the present invention, at the time of recovering the composite particulates, the inclination angle of the rotary body can be varied so that the bottom surface of the rotary body again forms the horizontal surface perpendicular to the direction of gravity, and, therefore, the composite particulates prepared can be recovered at good efficiency.

When the strength with which the particulates 2 contained in the rotary body 1 is stirred is not appropriate, it is difficult to cause the adhering material to adhere to the surfaces of the particulates 2 in a substantially uniform film thickness.

Specifically, in the case where the amount of the particulates 2 contained in the rotary body 1 is small, if the strength of stirring by the stirrer is high, the particulates 2 pressed against the side wall 1b of the rotary body 1 would easily come out of position. Therefore, it is difficult to prepare the composite particulates 20. On the other hand, in the case where the amount of the particulates 2 contained in the rotary body 1 is large, if the strength of stirring by the stirrer is low, the adhering material would adhere to only the particulates 2 present on the surface side, of the plurality of particulates 2 stacked to an arbitrary thickness from the side wall 1b. Therefore, it is difficult to cause the adhering material to adhere to the plurality of particulates 2 substantially uniformly, thereby preparing the composite particulates 20 desired.

The rotating speed for producing the centrifugal forces with which to press the particulates 2 against the side wall 1b of the rotary body 1 is substantially constant, irrespectively of the amount of the particulates 2 contained in the rotary body 1. Therefore, it is preferable to change the form of the stirrer according to the amount of the particulates 2 contained in the rotary body 1, the particle diameter of the particulates 2, the fluidity of the particulates 2, etc.

FIGS. 6A to 6C illustrate schematic configurations of various forms of stirrers.

As shown in FIG. 6A, in the case where the amount of the particulates 2 contained in the rotary body 1 is large, i.e., where the layer of the particulates 2 to be pressed against the side wall 1b of the rotary body 1 by centrifugal forces is thick, a stirring member 8 in which a surface member 8a for surface contact with the plurality of particulates 2 is attached to a support member 8b is preferably used. Since the rotary body 1 is rotated at such a speed as to exert centrifugal forces on the particulates 2, the surface contact of the surface member 8a with the particulates 2 in rotation ensures that the particulates 2 on the surface side and the particulates 2 on the side of the side wall 1b of the rotary body 1 are stirred while the individual particulates 2 themselves are rotating.

Incidentally, the expression "the case where the amount of the particulates 2 is large" means the case where the layer of the particulates 2 pressed by the centrifugal force has a thickness of about 5 to 8 cm, in a rotary body 1 having a bottom surface 1a with a diameter of about 40 cm, a side wall 1b with a height of about 10 cm, and a flange part 1c with a width of about 10 cm.

As shown in FIG. 6B, in the case where the amount of the particulates 2 contained in the rotary body 1 is somewhat small, i.e., where the layer of the particulates 2 pressed against the side wall 1b of the rotary body 1 is somewhat thin, a stirring member 9 in which a plurality of bar-like members 9a for line contact with the plurality of particulates 2 are attached to a support member 9b in a combtooth-like form is preferably used. With the bar-like members 9a inserted between the plurality of particulates 2 and with the support member 9b reciprocated in the direction parallel to the rotational axis of the rotary body 1, the plurality of particulates 2 are entirely stirred uniformly.

Incidentally, the expression "the case where the amount of the particulates 2 is somewhat small" means the case where the layer of the particulates 2 pressed by the centrifugal forces has a thickness of about 3 to 4 cm, in a rotary body 1 having a bottom surface 1a with a diameter of about 40 cm, a side wall 1b with a height of about 10 cm, and a flange part 1c with a width of about 10 cm.

As shown in FIG. 6C, in the case where the amount of the particulates 2 contained in the rotary body 1 is small, i.e., where the layer of the particulates 2 pressed against the side wall 1b of the rotary body 1 is thin, a stirring member 11 in which a plurality of bar-like members 11a for point contact with the plurality of particulates 2 are radially projected from a support member 11b is preferably used. With the tips of the bar-like members 11a put into point contact with the particulates 2 the amount of which is small and the moment of inertia of which is small, by the rotation of the rotary body 1, the plurality of particulates 2 are entirely stirred uniformly.

Incidentally, the expression "the case where the amount of the particulates 2 is small" means the case where the layer of the particulates 2 pressed by the centrifugal forces has a thickness of about 1 to 2 cm, in a rotary body 1 having a bottom surface 1a with a diameter of about 40 cm, a side wall 1b with a height of about 10 cm, and a flange part 1c with a width of about 10 cm.

The method of preparing composite particulates according to an embodiment of the present invention includes the steps of containing particulates to which an adhering material is to be made to adhere, in a rotary body having a bottom surface and a side wall; rotating the rotary body so as to apply centrifugal forces to the particulates in the rotary body; and varying the inclination of the rotary body to an arbitrary inclination angle in the range from an angle at which the bottom surface of the rotary body forms a horizontal surface perpendicular to the direction of gravity to an angle at which the bottom surface forms a vertical surface parallel to the direction of gravity, and supporting the rotary body at the arbitrary inclination angle.

The method of preparing composite particulates according to this embodiment, preferably, includes a step of vapor-depositing the adhering material to the particulates given the centrifugal forces. In addition, the method preferably includes a step of stirring the particulates given the centrifugal forces.

According to this embodiment of the present invention, in each of the step of charging the rotary body with the particulates, the step of adhesion of the adhering material to the particulates, and the step of recovering the composite particulates, the inclination of the rotary body for containing the particulates therein can be varied to an angular position at which the relevant step can be easily carried out. Therefore, the adhering material can be adhered to the surfaces of the particulates substantially uniformly, the recovery of the composite particulates can be enhanced, and the productivity can be enhanced.

Example

Now, the embodiments of the present invention will be described, based on a non-limitative example thereof.

Example

Using the composite particulate preparing apparatus 10 as shown in FIGS. 1 to 5, an adhering material (bismuth) was vapor-deposited on iron particulates having a specific gravity of about 2 and a mean particle diameter of 5 μm.

First, the rotary body 1 having a bottom surface 1a with a diameter of about 40 cm, a side wall 1b with a height of about 10 cm, and a flange part 1c with a width of about 10 cm, of the composite particulate preparing apparatus 10, was set in such an angular position that the bottom surface 1a of the rotary body 1 forms a horizontal surface perpendicular to the direction of gravity. In this condition, the rotary body 1 was charged with iron particulates in such an amount that the layer of the particulates 2 pressed by centrifugal forces would have a thickness of about 3 to 4 cm.

Next, the rotary body 1 was rotated at 100 rpm to exert the centrifugal forces on the iron particulates, thereby pressing the iron particulates against the side wall 1b of the rotary body 1. Under this condition, the inclination of the rotary body 1 was varied by the inclination varying device 4 to an angular position at which the bottom surface 1a of the rotary body 1 formed a vertical surface parallel to the direction of gravity (an inclination angle of 90°). In this condition, while the iron particulates in the rotary body 1 were stirred by the stirring member 6 and the film thickness was measured by the film thickness monitor 7, bismuth was vapor-deposited on the iron particulates, to prepare composite particulates.

Thereafter, the inclination varying device 4 was again operated to vary the inclination of the rotary body 1 from an angular position at which the bottom surface 1a of the rotary body 1 formed a vertical surface parallel to the direction of gravity to an angular position at which the bottom surface 1a formed a horizontal surface perpendicular to the direction of gravity, the centrifugal machine 3 was stopped, and the composite particulates 20 were recovered. The recovery was 98%.

Comparative Example

Composite particulates were prepared in the same manner as in Example above, except that a rotary body so supported that the bottom surface of the rotary body forms a vertical surface parallel to the direction of gravity was used and the inclination angle of the rotary body was kept unchanged. The recovery of the composite particulates was 70 to 90%.

It should be understood by those skilled in the art that various modifications, combinations, sub-combinations and alterations may occur depending on design requirements and other factor in so far as they are within the scope of the appended claims or the equivalents thereof.

What is claimed is:

1. An apparatus for preparing composite particulates, comprising:
    a rotary body having a bottom surface, a side wall, and a flange provided at one end part of the side wall extending perpendicularly from the one end part to face the bottom surface, the flange being provided with an opening through which the rotary body is charged with particulates, the rotary body being operative to contain the particulates to which an adhering material is to be made to adhere, the rotary body including a vapor deposition device in which the adhering material is evaporated by heating to start vapor deposition of the adhering material on the particulates;
    a centrifugal machine configured to rotate said rotary body as to apply centrifugal forces to said particulates in said rotary body, the rotating speed of the rotary body is greater than 2G as exerted on the particulates;
    a film thickness monitor for measuring the film thickness of the adhering material having adhered to the particulates in response to the vapor deposition; and
    an inclination varying device for varying the inclination of said rotary body during coating to an arbitrary inclination angle in the range from an angle at which said bottom surface of said rotary body forms a horizontal surface perpendicular to the direction of gravity, or horizontal position, to an angle at which said bottom surface forms a vertical surface parallel to the direction of gravity, or vertical position, and supporting said rotary body at said arbitrary inclination angle,
    wherein,
        the vapor deposition device is configured to direct the adhering material toward a top portion of the rotary body once the inclination varying device rotates the rotary body to said inclination angle,
        the inclination varying device includes a support member which supports the rotary body, the support member having an axis about which the support member pivots,
        the rotary body has an axis of rotation that is variable ranging from a position where the axis of rotation is parallel to the direction of gravity to a position where the axis of rotation is perpendicular to the direction of gravity, and
        the axis about which the support member pivots and the axis of rotation of the rotary body are not parallel.

2. The apparatus for preparing composite particulates as set forth in claim 1, wherein said inclination angle of said rotary body is such an angle that said particulates given the centrifugal forces do not drop in said direction of gravity.

3. The apparatus for preparing composite particulates as set forth in claim 1, further comprising any one selected from the group consisting of
    stirring member coming into surface contact with said plurality of particulates in said rotary body,
    a combtooth-shaped member coming into line contact with said plurality of particulates in said rotary body, and
    a plurality of bar-like members radially projected from a support member coming into point contact with said plurality of particulates in said rotary body.

4. The apparatus for preparing composite particulates as set forth in claim 1, wherein the adhering material is vapor-deposited on the particulates in an optimal film thickness before activating the apparatus.

5. The apparatus for preparing composite particulates as set forth in claim 1, wherein a turning support member supports the rotary body and the centrifugal machine, the turning support member is turned by the inclination varying device to vary the inclination angle of the rotary body.

6. The apparatus for preparing composite particulates as set forth in claim 1, wherein at a time of recovering the particulates, the inclination angle of the rotary body is varied so that the bottom surface of the rotary body again forms the horizontal surface perpendicular to the direction of gravity enabling efficient recovery of the composite particulates.

7. The apparatus for preparing composite particulates as set forth in claim 3, wherein the stirring member is utilized when a layer of the particulates pressed by the centrifugal force has a thickness of about 5 to 8 cm.

8. The apparatus for preparing composite particulates as set forth in claim 7, where the combtooth-shaped member is utilized when a layer of the particulates pressed by the centrifugal forces has a thickness of about 3 to 4 cm.

9. The apparatus for preparing composite particulates as set forth in claim 8, wherein the bar-like members are utilized when a layer of the particulates pressed by the centrifugal forces has a thickness of about 1 to 2 cm.

10. The apparatus for preparing composite particulates as set forth in claim 9, wherein the stirring member, combtooth-shaped member, and the bar-like member are utilized in a rotary body with a bottom surface with a diameter of approximately 40 cm, a side wall with a height of approximately 10 cm, and a flange part with a width of approximately 10 cm.

11. The apparatus for preparing composite particulates as set forth in claim 1, wherein the adhering material is selected from the group consisting of low-melting-point elemental metals including copper and bismuth, alloys, and organic matters including paraffins and higher aliphatic acids.

12. The apparatus for preparing composite particulates as set forth in claim 1, wherein the particulates are high-melting-point metals including iron or carbon.

13. The apparatus for preparing composite particulates as set forth in claim 1, wherein the rotary body is at rest in a condition where the bottom surface forms the horizontal surface perpendicular to the direction of gravity for charging the rotary body with the particulates.

* * * * *